US005644331A

United States Patent [19]
Hazama

[11] Patent Number: 5,644,331
[45] Date of Patent: Jul. 1, 1997

[54] FLAT PANEL DISPLAY DEVICE AND METHOD OF INSPECTION OF SAME

[75] Inventor: Yoshikazu Hazama, Kanagawa, Japan

[73] Assignee: Sony Corporation, Tokyo, Japan

[21] Appl. No.: 262,691

[22] Filed: Jun. 20, 1994

[30] Foreign Application Priority Data

Jun. 21, 1993 [JP] Japan ................................ 5-149560

[51] Int. Cl.⁶ ............................................ G09G 3/36
[52] U.S. Cl. ............................ 345/99; 345/98; 345/100; 345/904
[58] Field of Search .................... 345/98, 99, 100, 345/904, 104

[56] References Cited

U.S. PATENT DOCUMENTS

| | | | |
|---|---|---|---|
| 4,352,102 | 9/1982 | Kramer | 345/99 |
| 4,430,648 | 2/1984 | Togashi et al. | 340/718 |
| 5,093,654 | 3/1992 | Swift et al. | 340/781 |
| 5,184,082 | 2/1993 | Nelson | 324/537 |
| 5,206,633 | 4/1993 | Zalph | 340/784 |
| 5,506,516 | 4/1996 | Yamashita et al. | 324/770 |

FOREIGN PATENT DOCUMENTS

| | | |
|---|---|---|
| 0 436 777 | 7/1991 | European Pat. Off. . |
| 0 494 610 | 7/1992 | European Pat. Off. . |
| 0 525 980 | 2/1993 | European Pat. Off. . |
| 2-106795 | 4/1990 | Japan ......................... 345/98 |

Primary Examiner—Richard Hjerpe
Assistant Examiner—Vui T. Tran
Attorney, Agent, or Firm—Hill, Steadman & Simpson

[57] ABSTRACT

A flat panel display device having formed on a drive substrate, a logic circuit for combining a first inspection-use output of a horizontal scanning circuit and a second inspection-use output of a vertical scanning circuit and a combined inspection-use output terminal for outputting the combined inspection-use output obtained through the logic circuit. Another flat panel display device of the present invention has switch circuits for using a first input terminal of the horizontal scanning circuit as an inspection-use output terminal of the vertical scanning circuit and using a second input terminal of the vertical scanning circuit as an inspection-use output terminal of the horizontal scanning circuit.

13 Claims, 4 Drawing Sheets

Hout

Vout

Cout

FLAT PANEL DISPLAY DEVICE AND METHOD OF INSPECTION OF SAME

BACKGROUND OF THE INVENTION

1. Field of the Invention

The present invention relates to a flat panel display device and a method of inspection of the same, more particularly relates to a flat panel display device, an active matrix drive substrate, and methods of inspection of the same which enable the number of output terminals used for the inspection of the horizontal scanning circuit and the vertical scanning circuit formed on the drive substrate of a liquid crystal display device, for example, to be slashed and the inspection time to be shortened.

2. Description of the Related Art

A representative type of a flat panel display device is a liquid crystal device (LCD). A LCD generally is comprised of a drive substrate on which a horizontal scanning circuit, vertical scanning circuit, and a pixel region are formed, a counter substrate on which counter electrode is formed, and a liquid crystal sealed between the two. The pixel region has a plural of picture elements in a matrix array. Each picture element has a pixel electrode and a drive circuit. The drive circuits are, for example, comprised of switch elements, and are driven for each picture element selected by the horizontal scanning circuit and the vertical scanning circuit to cause an optical change in the portion of the liquid crystal corresponding to each picture element and thereby display an image.

The above-mentioned horizontal scanning circuit and vertical scanning circuit can be formed on a substrate separate from the drive substrate on which the pixel drive circuits are formed, but the trend is for formation on the same drive substrate due to the demands for greater compactness of the device etc.

In the process of production of an LCD, various inspection processes are required at each stage of the production. For example, one of these is the inspection of the operation of the horizontal scanning circuit and the vertical scanning circuit. If these circuits do not both operate normally, the finished LCD will also not operate normally.

Therefore, in the prior art, provision was made of an inspection-use output terminal for each of the horizontal scanning circuit and the vertical scanning circuit (a total of two inspection-use output terminals), these circuits were independently made to operate after the production of the drive substrate or after the assembly of the drive substrate and the counter substrate and the filling of the liquid crystal, the output waveforms were taken out from the output terminals, and the inspections were performed using the same. That is, in the conventional method of inspection, it was considered that at least two inspection-use output terminals were required for inspecting the horizontal scanning circuit and the vertical scanning circuit.

However, these two inspection-use output terminals are used only for inspection purposes and are not required at all during the normal state of usage of the LCD. There has been a demand for reduction of the unnecessary output terminals as much as possible from the viewpoint of preventing external disturbances such as static electricity.

Further, in the prior art, the horizontal scanning circuit and the vertical scanning circuit were inspected independently of each other, so there was the problem of a long time being required for the inspections.

SUMMARY OF THE INVENTION

The present invention has been made in consideration of this actual situation and has as its first object the provision of a flat panel display device, an active matrix drive substrate, and methods of inspection of the same which slash the number of output terminals used for the inspection of the horizontal scanning circuit and the vertical scanning circuit and reduce the effects of static electricity and other external disturbances.

Further, the present invention has as its second object the provision of a flat panel display device, an active matrix drive substrate, and methods of inspection of the same which enable the inspection time to be shortened.

The first flat panel display device according to the present invention for achieving the first and second objects mentioned above, comprises a substrate; a pixel region comprised of a plural of picture elements formed on said substrate in a manner of a matrix array; a vertical scanning circuit for outputting a selecting pulse and selecting a column of said picture elements of said pixel region in series, said scanning circuit formed on said substrate; a horizontal scanning circuit for outputting a selecting pulse and selecting a row of said picture elements of said pixel region in series so as to provide picture signals to the selected column of said picture elements of said pixel region, said scanning circuit formed on said substrate; a logic circuit for combining the output signals output from the vertical scanning circuit and horizontal scanning circuit, said logic circuit formed on said substrate; and an inspection-use output terminal for outputting a inspection-use output signal obtained through said logic circuit, the inspection-use output terminal formed on said substrate.

The picture element of the pixel region may be comprised of a pixel electrode and a switch element.

The first active matrix drive substrate according to the present invention for achieving the first and second objects mentioned above has formed on it a horizontal scanning circuit, a vertical scanning circuit, pixel drive circuits, a logic circuit for combining a first output of the horizontal scanning circuit and a second output of the vertical scanning circuit and a combined inspection-use output terminal for outputting a combined inspection-use output obtained through said logic circuits.

The method of inspection of an active matrix drive substrate according to the present invention for achieving the second object mentioned above, comprises the steps of combining a first inspection-use output of the horizontal scanning circuit and a second inspection-use output of the vertical scanning circuit through logic circuits and inspecting the horizontal scanning circuit and the vertical scanning circuit based on a waveform of a third combined inspection-use output obtained through the logic circuit.

In the method of the present invention, the logic circuit may be provided on said active matrix drive substrate or may be provided at the outside of said active matrix drive substrate.

The second flat panel display device according to the present invention for achieving the first object mentioned above comprises a switch means for using a first input terminal of the horizontal scanning circuit as an inspection-use output terminal of the vertical scanning circuit and using a second input terminal of the vertical scanning circuit as an inspection-use output terminal of the horizontal scanning circuit.

The second active matrix drive substrate according to the present invention for achieving the first object mentioned above comprises a switch means for using a first input terminal of the horizontal scanning circuit as an inspection-use output terminal of the vertical scanning circuit and using a second input terminal of the vertical scanning circuit as an inspection-use output terminal of the horizontal scanning circuit.

In the first active matrix drive substrate and first flat panel display device having the same according to the present invention, the two inspection-use output terminals which has been required in the prior art are made a single combined inspection-use output terminal. Therefore, in the first active matrix drive substrate and the first flat panel display device of the present invention, it is possible to use a single output terminal and therefore there is less susceptibility to the effects of external disturbances such as static electricity.

Further, in the first method of inspection of the active matrix drive substrate and the first method of inspection of the flat panel display device according to the present invention, the inspection-use output of the horizontal scanning circuit and the inspection-use output of the vertical scanning circuit are combined through the logic circuit and the horizontal scanning circuit and the vertical scanning circuit are simultaneously inspected based on the waveform of the combined inspection-use output obtained through the logic circuit, so it is possible to reduce the inspection time.

In the second flat panel display device and the second active matrix drive substrate according to the present invention, provision is made of a switch means for using the input terminal of the horizontal scanning circuit as the inspection-use output terminal of the vertical scanning circuit and for using the input terminal of the vertical scanning circuit as the inspection-use output terminal of the horizontal scanning circuit, so there is no longer a need to provide an inspection-use only output terminal at all. As a result, the fear of the effect of external disturbances such as static electricity caused by the output terminals is eliminated.

BRIEF DESCRIPTION OF THE DRAWINGS

The above and other objects and features of the present invention will be more apparent from the following description of the preferred embodiments with reference to the accompanying drawings, wherein.

DESCRIPTION OF THE PREFERRED EMBODIMENTS

Figure 1:
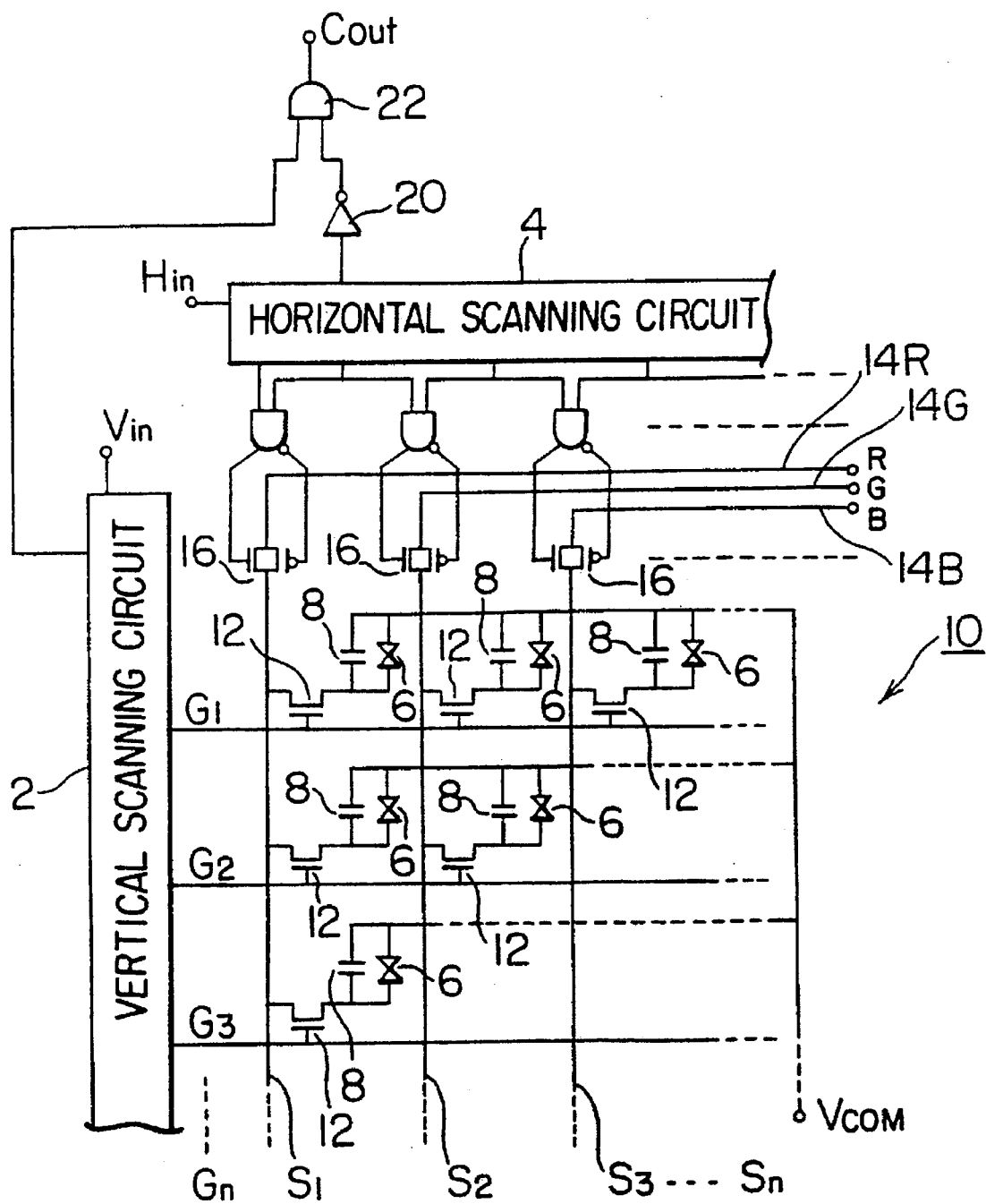
FIG. 1 is a schematic view of a liquid crystal drive circuit having a combined inspection-use terminal used for the liquid crystal display device according to a first embodiment of the present invention.

Below, a detailed explanation will be given of the flat panel display device, drive substrate, and methods of inspection of the same according to the present invention based on the embodiments shown in the drawings.

In the embodiments shown below, examples are given of application of the present invention to a liquid crystal display device, but the present invention may be similarly applied to all flat panel display devices performing a flat display using an active matrix drive substrate etc. in addition to liquid crystal display devices.

As shown in FIG. 1, the LCD of the present embodiment is a so-called "scanner-on-chip" type LCD and has an active matrix drive substrate 10. At the surface of the drive substrate 10 is disposed a not shown counter substrate at a predetermined clearance. A liquid crystal is filled between these substrates to constitute the liquid crystal display device.

The drive substrate 10 of the present embodiment has formed on it the gate lines G1, G2, ... Gn and signal lines S1, S2, ... Sn disposed so as to substantially perpendicularly intersect the gate lines. Note that the gate lines G1, G2, ... Gn and the signal lines S1, S2, ... Sn need only be substantially perpendicularly intersecting seen overall. Seen closer, the signal lines S1, S2, ... Sn or the gate lines G1, G2, ... Gn may be serpentine. For example, in a delta array etc., the signal lines S1, S2, ... Sn are serpentine.

The intersecting portions of the gate lines G1, G2, ... Gn and the signal lines S1, S2, ... Sn correspond to picture elements. At these portions, for example, switch elements 12, constituted for example by TFT's, pixel electrodes and capacitance elements 8 are formed. The active matrix drive substrate has disposed facing it via a liquid crystal layer the counter substrate on which common electrode is formed. As a result, as shown in FIG. 1, a liquid crystal 6 is disposed between the pixel electrode and the common electrode and is connected for each picture element in parallel to a capacitance element 8. By driving the switch element 12 and selectively applying voltage to the pixel electrode of each picture element, it is possible to partially change the molecular orientation of the liquid crystal portion for each picture element and thereby display an image. Note that the common potential input to the common electrode of the counter substrate is input from the common electrode terminal VCOM.

The gate lines G1, G2, ... Gn are connected to a vertical scanning circuit 2, enabling the gate lines G1, G2, ... Gn to be successively scanned. Further, the signal lines S1, S2, ... Sn are connected through scanning switches 16 to the video input lines 14R, 14G, and 14B. Video signals are input from the video input lines 14R, 14G, and 14B toward the signal lines S1, S2, ... Sn. In this embodiment, as the video input lines, use was made of three types of input lines for R, G, and B but it is also possible to use a single input line when a color image is not required.

The scanning switches 16 are connected through the output logic circuits to the horizontal scanning circuit 4. The scanning switches 16 are successively opened in accordance with the scanning signals from the horizontal scanning circuit 4 and the video signals are sent to the signal lines S1, S2, ... Sn in synchronization with the scanning of the gate lines G1, G2, ... Gn.

In this embodiment, the output terminal of the horizontal scanning circuit 4 has connected to it the input terminal of a NOT circuit 20, and the output terminal of the NOT circuit and the output terminal of the vertical scanning circuit 2 are connected to the input terminal of an AND circuit 22. The output terminal of the AND circuit 22 is connected to the combined inspection-use output terminal COUT. These logic circuits 20 and 22 and combined inspection-use output terminal COUT are formed integrally together with the horizontal scanning circuit 4 and the vertical scanning circuit 2 on the active matrix drive substrate 10.

That is, in an LCD having the active matrix drive substrate 10 of the present invention, provision is made, as the input terminal, of the input terminal Hin to the horizontal scanning circuit 4, the input terminal Vin to the vertical scanning circuit 2, the video input lines 14R, 14G, and 14B, and the common electrode terminal VCOM and provision is made, as the output terminal, of only the single combined inspection-use output terminal COUT.

In the active matrix drive substrate 10 of the present embodiment or an LCD having that substrate 10, the horizontal scanning circuit 4 and the vertical scanning circuit 2 may be inspected to verify their operation by inputting a clock signal from the input terminals Hin and Vin, simultaneously driving these scanning circuits 2 and 4, taking out the combined inspection-use signal from the combined inspection-use output terminal COUT, and detecting the waveform.

Figure 2A:
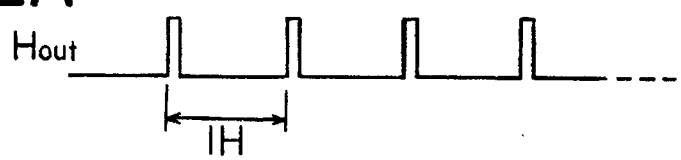
FIGS. 2A to 2D are graphs of the inspection-use output waveforms.
Figure 2B:

The output waveform from the horizontal scanning circuit 4 is shown in FIG. 2A. If the horizontal scanning circuit 4 is normal, then as shown in FIG. 2A, a pulse waveform with a 1H period is obtained. FIG. 2B is an output waveform after passing through the NOT circuit 20 shown in FIG. 1, which is inverted from the waveform shown in FIG. 2A.

Figure 2C:

FIG. 2C shows the output waveform in the case of a normal vertical scanning circuit 2 shown in FIG. 1. As shown in FIG. 2C, a pulse signal of a width of a minimum 1H (usually about 2H) is output in a single field period.

Figure 2D:

Accordingly, when the horizontal scanning circuit 4 and the vertical scanning circuit 2 are normal, the output waveform at the combined inspection-use output terminal COUT after passing through the AND circuit 22 shown in FIG. 1 becomes the waveform of the superposed waveforms of FIG. 2B and FIG. 2C as shown in FIG. 2D.

In the method of inspection of the present embodiment, it is possible to detect an abnormality in the horizontal scanning circuit 4 and/or the vertical scanning circuit 2 by detecting the output waveform from the combined inspection-use output terminal COUT and comparing the output waveform with an output waveform of the normal period. For example, if there is an abnormality in the horizontal scanning circuit 4 and the output waveform is a 0 output with no pulse, the output waveform from the combined inspection-use output terminal COUT becomes an output waveform completely identical to the output waveform from the vertical scanning circuit 2 (FIG. 2C). By detecting this output waveform, it is possible to detect an abnormality in the horizontal scanning circuit 4.

Further, if there is an abnormality in the horizontal scanning circuit 4 and the output waveform is a 1 output with no pulse, the output waveform from the combined inspection-use output terminal COUT becomes a flat output waveform with no pulse. By detecting this output waveform, it is possible to detect an abnormality in the horizontal scanning circuit 4.

Further, if there is an abnormality in the vertical scanning circuit 2 and the output waveform is a 0 output with no pulse, the output waveform from the combined inspection-use output terminal COUT becomes a flat output waveform with no pulse. By detecting this output waveform, it is possible to detect an abnormality in the vertical scanning circuit 2.

Still further, when there is an abnormality in the horizontal scanning circuit 4 and an abnormal pulse occurs every 1H in the output waveform etc., it is possible to detect an abnormality in the horizontal scanning circuit 4 by examining the output waveform from the combined inspection-use output terminal COUT and comparing that waveform with the normal waveform.

In the present invention, it is possible to detect other abnormalities as well by examining the output waveform from the combined inspection-use output terminal COUT and comparing the waveform with a normal waveform. During this detection, to help automation, use may be made of image processing technology. That is, the detected waveform and the normal waveform may be automatically judged using image processing technology.

In this embodiment, the two inspection-use output terminals required in the prior art are made a single combined inspection-use output terminal COUT. Therefore, in an active matrix drive substrate of the present embodiment and an LCD having the same, the number of output terminals is slashed and therefore there is less susceptibility to external disturbances such as static electricity. Further, in the method of inspection of the present embodiment, the horizontal scanning circuit 4 and the vertical scanning circuit 2 are simultaneously inspected, so it is possible to reduce the inspection time.

Note that in the above embodiment, the output of the horizontal scanning circuit 4 was made to be input to the NOT circuit 20, but it is also possible to construct it so that the output of the vertical scanning circuit 2 is input to the NOT circuit 20. However, in the case of this embodiment, it is preferable to measure the output waveform during the minimum one field.

Next, an explanation will be made of another embodiment of the present invention based on FIG. 3.

Figure 3:
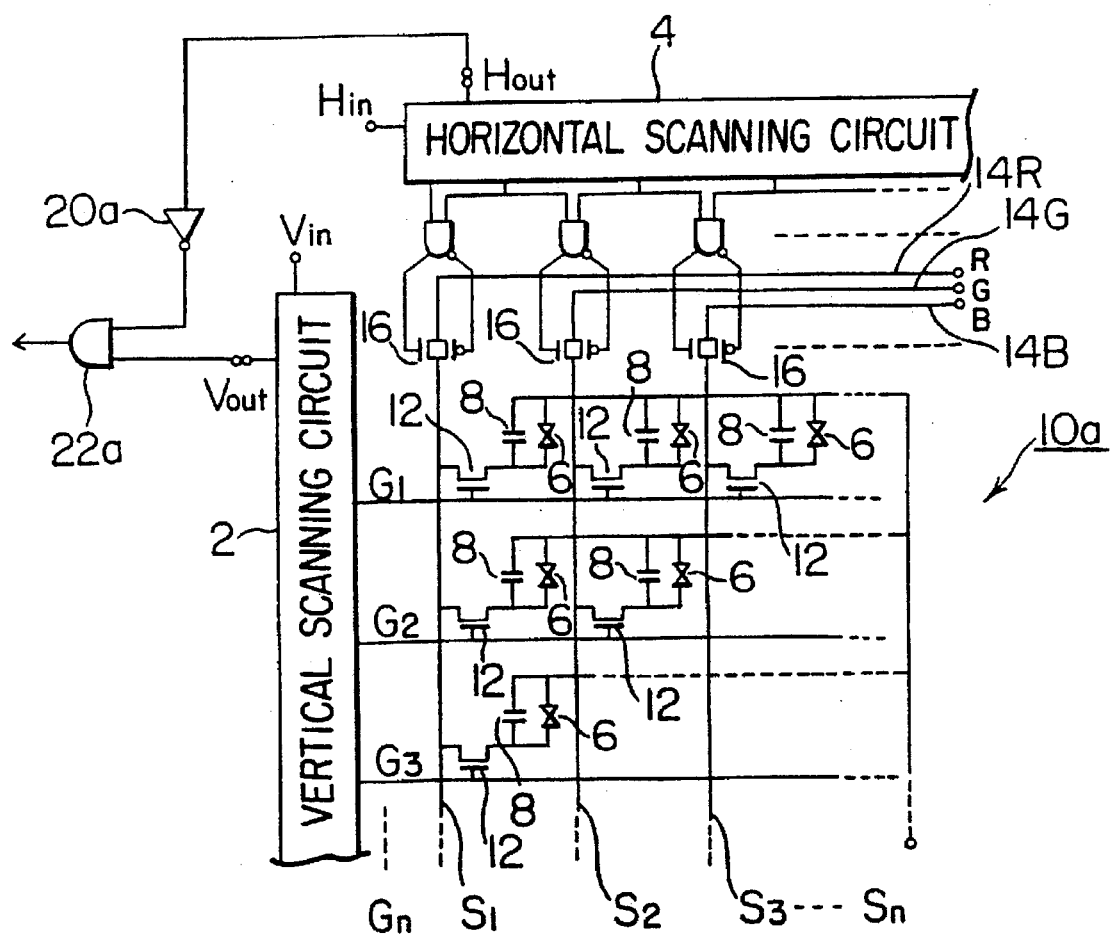
FIG. 3 is a schematic view of a liquid crystal drive circuit, with an inspection circuit added, used for a liquid crystal display device according to another embodiment of the present invention.

In the active matrix drive substrate 10a used for the LCD according to the embodiment shown in FIG. 3, a substrate 10a is provided with two output terminals, that is, an output terminal HOUT of the horizontal scanning circuit 4 and an output terminal VOUT of the vertical scanning circuit 2. These output terminals have connected to them logic circuits comprised of a NOT circuit 20a and circuit 22a.

In this embodiment, unlike the embodiment shown in FIG. 1, the logic circuits 20a and 22a are formed at the outside of the substrate 10a.

In this embodiment, the active matrix drive substrate 10a has two inspection-use output terminals HOUT and VOUT like with the conventional substrate, but when inspecting the horizontal scanning circuit 4 and the vertical scanning circuit 2, these two inspection-use output terminals HOUT and VOUT are connected to the logic circuits 20a and 22a, the horizontal scanning circuit 4 and vertical scanning circuit 2 are simultaneously driven, and the output of the AND circuit 22a is judged so as to enable simultaneous inspection to verify the operation of the horizontal scanning circuit 4 and the vertical scanning circuit 2 in the same way as the embodiment shown in FIGS. 1 and 2. Accordingly, in this embodiment, it is possible to simultaneously inspect the horizontal scanning circuit 4 and vertical scanning circuit 2 with a single judgement and therefore possible to reduce the inspection time.

Next, an explanation will be made of another embodiment of the present invention.

Figure 4:
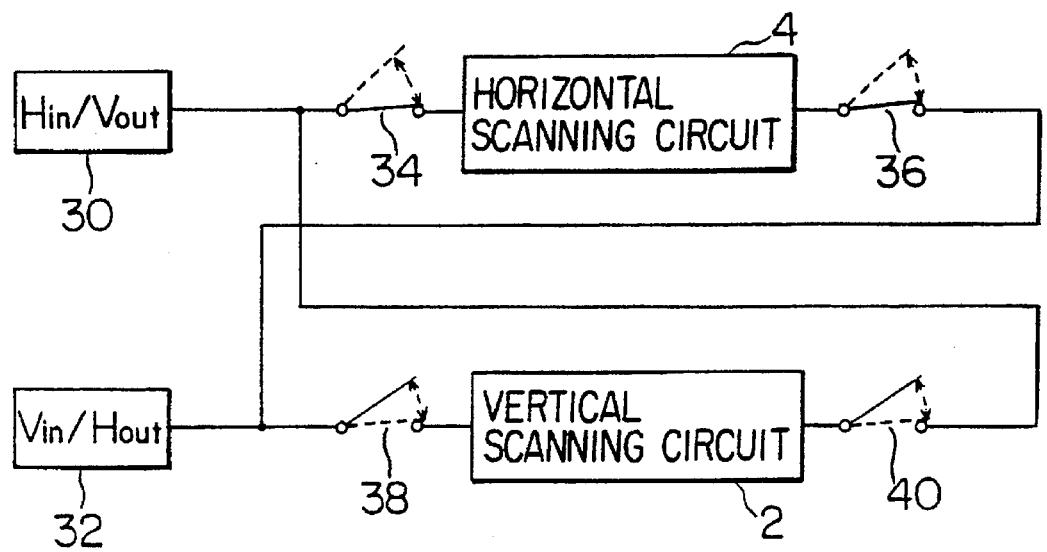
FIG. 4 is a schematic view of an inspection-use terminal construction of a horizontal scanning circuit and a vertical scanning circuit according to another embodiment of the present invention.

As shown in FIG. 4, the integral-scanner type active matrix drive substrate of the present embodiment is comprised of a drive substrate on which is formed a horizontal scanning circuit 4 and vertical scanning circuit 2 together with switch circuits 34, 36, 38, and 40 comprised for example of TFT's (thin film transistors) by the illustrated wiring configuration. In FIG. 4, reference numeral 30 is an input terminal to the horizontal scanning circuit 4, which also serves as the output terminal of the inspection-use output from the vertical scanning circuit 2. Further, reference numeral 32 is an input terminal to the vertical scanning circuit 2, which also serves as the output terminal of the inspection-use output from the horizontal scanning circuit 4. Note that the liquid crystal drive circuit is omitted from the illustration.

In this embodiment, the drive inspection of the horizontal scanning circuit 4 and the drive inspection of the vertical scanning circuit 2 are performed separately. For example, when inspecting the horizontal scanning circuit 4, the input terminal 32 is used as the inspection-use output terminal of the horizontal scanning circuit, the drive signal for the vertical scanning circuit 2 is not input from the input terminal 32, the switch circuits 38 and 40 are opened, and the switch circuits 34 and 36 are closed. Further, a drive signal for driving the horizontal scanning circuit 4 is input from the input terminal 30.

Since the switch circuits 38 and 40 are open and the switch circuits 34 and 36 are closed, the vertical scanning circuit 2 is not erroneously operated by the drive signal from the input terminal or the output signal from the horizontal scanning circuit 4. The output signal from the horizontal scanning circuit 4 is output from the input terminal/inspection-use output terminal 32 and the output from that terminal is detected so as to enable inspection to verify the operation of the horizontal scanning circuit 4.

For inspecting the operation of the vertical scanning circuit 2, the input terminal 30 is used as the inspection-use output terminal of the vertical scanning circuit 2, the drive signal for the horizontal scanning circuit 4 is not input from the input terminal 30, the switch circuits 38 and 40 are closed, and the switch circuits 34 and 36 are open. Further, the drive signal for driving the vertical scanning circuit 2 is input from the input terminal 32.

Since the switch circuits 38 and 40 are closed and the switch circuits 34 and 36 are open, the horizontal scanning circuit 4 is not erroneously driven by the drive signal from the input terminal 32 or the output signal from the vertical scanning circuit 2. The output signal from the vertical scanning circuit 2 is output from the input terminal/inspection-use output terminal 30 and the output from that terminal is detected to enable inspection to verify the operation of the vertical scanning circuit 2.

When not during an inspection, but during actual driving, the switch circuits 34 and 38 are closed, the switch circuits 36 and 40 are opened, and the drive signals from the respective input terminals 30 and 32 are input. As a result, the horizontal scanning circuit 4 and the vertical scanning circuit 2 synchronously drive and perform the liquid crystal display. At that time, since the switch circuits 36 and 40 are open, the outputs of the two inspection circuits 2 and 4 do not have an adverse effect on each other.

In this embodiment, no output terminal specially for use as inspection-use output is provided, but some of the input terminals are used as the inspection-use output terminals, so it is possible to eliminate the effect of external disturbances of static electricity etc. caused by the inspection-use output terminals.

Next, an embodiment more concrete than the embodiment shown in FIG. 4 will be explained based on FIG. 5.

Figure 5:
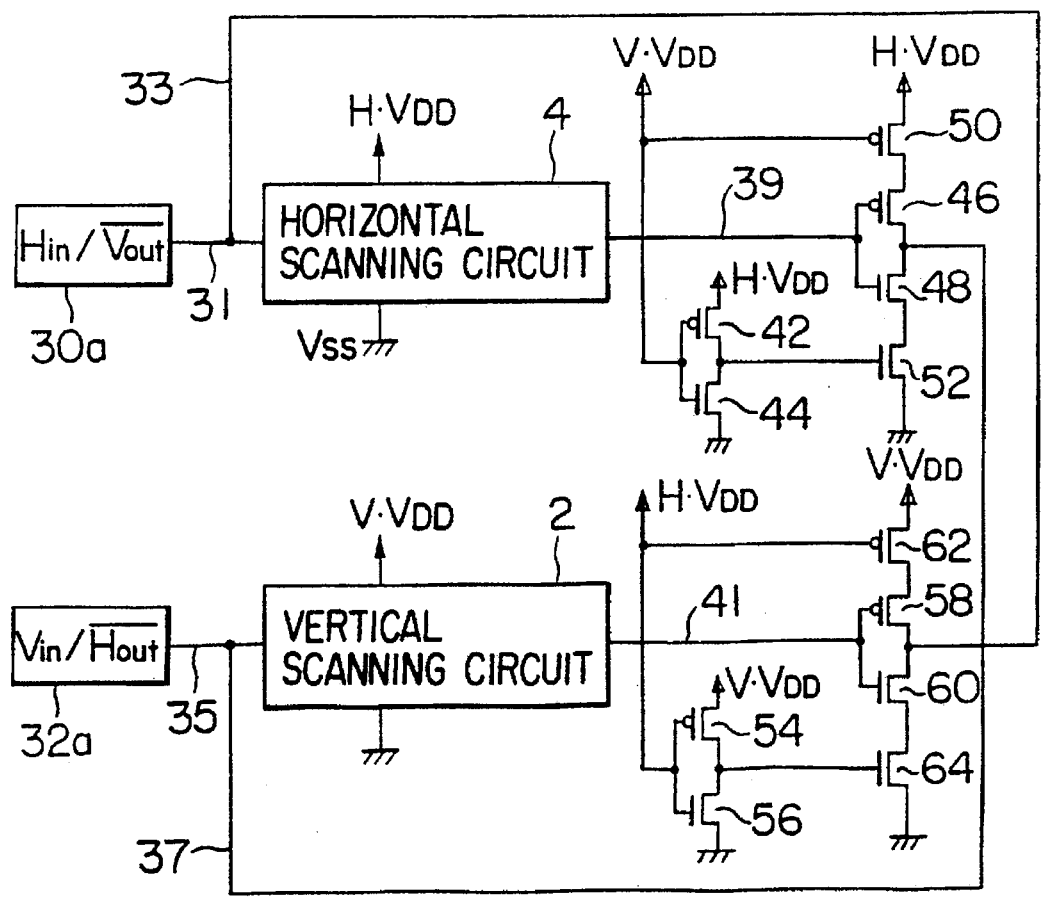
FIG. 5 is a circuit diagram showing more specifically the circuit shown in FIG. 4.

In the embodiment shown in FIG. 5, branch wiring 33 is provided at the connection wiring 31 between the input terminal 30a of the horizontal scanning circuit 4 and the horizontal scanning circuit 4. This branch wiring 33 is connected to the source and drain between the P-type MOS transistor 58 and the N-type MOS transistor 60 constituting the CMOS. The input terminal 30a of the horizontal scanning circuit 4 serves also as the inspection-use inverted output terminal of the vertical scanning circuit 2.

Further, branch wiring 37 is provided at the connection wiring 35 between the input terminal 32a of the vertical scanning circuit 2 and the vertical scanning circuit 2. This branch wiring 35 is connected to the source and drain between the P-type MOS transistor 46 and the N-type MOS transistor 48 constituting the CMOS. The input terminal 32a of the vertical scanning circuit 2 serves also as the inspection-use non-inverted output terminal of the horizontal scanning circuit 4.

The output wiring 39 of the horizontal scanning circuit 4 is connected to the gate between the P-type MOS transistor 46 and N-type MOS transistor 48 constituting the CMOS. At the two sides of the P-MOS transistor 46 and the N-type MOS transistor 48 constituting the CMOS are connected the P-type MOS transistor 50 and the N-type MOS transistor 52, respectively. At the drain of the P-type MOS transistor 50 is applied the power source voltage H·VDD for driving the horizontal scanning circuit 4. The source of the N-type MOS transistor 52 is grounded.

To the gate of the transistor 50 is applied the power source voltage V·VDD for driving the vertical scanning circuit 2. To the gate of the transistor 52 is applied an inverted signal of the power source voltage V·VDD from the CMOS constituted by the P-type MOS transistor 42 and the N-type MOS transistor 44. The CMOS constituted by the P-type MOS transistor 42 and the N-type MOS transistor 44 operates by the power source voltage H·VDD of the horizontal scanning circuit 4.

The output wiring 41 of the vertical scanning circuit 2 is connected to the gate between the P-type MOS transistor 58 and N-type MOS transistor 60 constituting the CMOS. At the two sides of the P-MOS transistor 58 and the N-type MOS transistor 60 constituting the CMOS are connected the P-type MOS transistor 62 and the N-type MOS transistor 64, respectively. At the drain of the P-type MOS transistor 62 is applied the power source voltage V·VDD for driving the vertical scanning circuit 2. The source of the N-type MOS transistor is grounded.

To the gate of the transistor 62 is applied the power source voltage H·VDD for driving the horizontal scanning circuit 4. To the gate of the transistor 64 is applied an inverted signal of the power source voltage H·VDD from the CMOS constituted by the P-type MOS transistor 54 and the N-type MOS transistor 56. The CMOS constituted by the P-type MOS transistor 54 and the N-type MOS transistor 56 operates by the power source voltage V·VDD of the vertical scanning circuit 2.

Note that the transistors 42, 44, 46, 48, 50, 52, 54, 56, 58, 60, 62, and 64 are constituted by TFT's etc. formed on the active matrix drive substrate.

In this embodiment, when inspecting the horizontal scanning circuit 4, the input terminal 32a is used as the inspection-use inverted output terminal of the horizontal scanning circuit 4 and no drive signal for the vertical scanning circuit 2 is input from the input terminal 32a. Further, the power source voltage H·VDD for driving the horizontal scanning circuit 4 is made the high level (1), the power source voltage V·VDD for driving the vertical scanning circuit 2 is made the low level (0), and a drive signal for driving the horizontal scanning circuit 4 is input from the input terminal 30a.

Since the power source voltage H·VDD is made the high level (1) and the power source voltage V·VDD for driving the vertical scanning circuit 2 is made the low level (0), the output from the horizontal scanning circuit 4 passes through the output wiring 39, is inverted by the transistors 46, 48 constituting the CMOS, and is output from the inspection-use output terminal 32a serving also as the input terminal. At that time, the branch wiring 33 becomes high in impedance, so there is no effect from the vertical scanning circuit 2 or effect on the vertical scanning circuit 2.

When inspecting the vertical scanning circuit 2, the input terminal 30a is used as the inspection-use inverted output terminal of the vertical scanning circuit 2 and no drive signal for the horizontal scanning circuit 4 is input from the input terminal 30a. Further, the power source voltage V·VDD for driving the vertical scanning circuit 2 is made the high level (1), the power source voltage H·VDD for driving the horizontal scanning circuit 4 is made the low level (0), and a drive signal for driving the vertical scanning circuit 2 is input from the input terminal 32a.

Since the power source voltage V·VDD is made the high level (1) and the power source voltage H·VDD for driving the horizontal scanning circuit 4 is made the low level (0), the output from the vertical scanning circuit 2 passes through the output wiring 41, is inverted by the transistors 58, 60 constituting the CMOS, and is output from the inspection-use output terminal 30a serving also as the input terminal. At that time, the branch wiring 37 becomes high in impedance, so there is no effect from the horizontal scanning circuit 4 or effect on the horizontal scanning circuit 4.

Further, during normal drive of the liquid crystal, the power source voltage V·VDD and the power source voltage H·VDD are made the high level (1), so the branching wiring 33, 37 both become high in impedance and the outputs from the scanning circuits 2 and 4 do not adversely affect each other.

Note that the present invention is not limited to the above-mentioned embodiments and that various modifications can be made within the scope of the invention.

As explained above, according to the present invention, it is possible to realize a flat panel display device and an active matrix drive substrate which can slash the number of output terminals used for the inspection of the horizontal scanning circuit and the vertical scanning circuit and can reduce the effects of external disturbances of static electricity and the like. Further, according to the methods of detection of the present invention, the inspection time can be shortened.

What is claimed is:

1. A flat panel display device comprising:
   a substrate;
   a pixel region comprised of a plural of picture elements formed on said substrate in a manner of a matrix array;
   a vertical scanning circuit for outputting a selecting pulse and selecting a column of said picture elements of said pixel region in series, said scanning circuit formed on said substrate;
   a horizontal scanning circuit for outputting a selecting pulse and selecting a row of said picture elements of said pixel region in series so as to provide picture signals to the selected column of said picture elements of said pixel region, said scanning circuit formed on said substrate;
   a logic circuit for combining selecting pulses output from said vertical scanning circuit and horizontal scanning circuit, said logic circuit formed on said substrate; and
   an inspection-use output terminal for outputting an inspection-use output signal obtained through said logic circuit, said inspection-use output terminal formed on said substrate.

2. A flat panel display device comprising:
   a substrate;
   a pixel region comprised of a plural of picture elements formed on said substrate in a manner of a matrix array;
   a vertical scanning circuit for outputting a selecting pulse and selecting a column of said picture elements of said pixel region in series, said scanning circuit having a first input terminal and formed on said substrate;
   a horizontal scanning circuit for outputting a selecting pulse and selecting a row of said picture elements of said pixel region in series so as to provide picture signals to the selected column of said picture elements of said pixel region, said scanning circuit having a second input terminal and formed on said substrate; and
   circuit means for using the first input terminal as an output terminal of said horizontal scanning circuit and using the second input terminal as an output terminal of said vertical scanning circuit.

3. The flat panel display device as set forth in claim 1, wherein the picture element of said pixel region comprises a pixel electrode and a switch element for driving said pixel electrode.

4. The flat panel display device as set forth in claim 2, wherein the picture element of said pixel region comprises a pixel electrode and a switch element for driving said pixel electrode.

5. A method of inspection of an active matrix drive substrate provided with a horizontal scanning circuit, a vertical scanning circuit, and pixel drive circuits for driving a plural of picture elements in a matrix array, comprising the steps of
   combining a first inspection-use output of the horizontal scanning circuit and a second inspection-use output of the vertical scanning circuit through a logic circuit and
   inspecting the horizontal scanning circuit and the vertical scanning circuit based on a waveform of a third combined inspection-use output obtained through the logic circuit.

6. The method of inspection of an active matrix drive substrate as set forth in claim 5, wherein the first inspection-use output and the second inspection-use output are combined through the logic circuit provided on said active matrix drive substrate.

7. The method of inspection of an active matrix drive substrate as set forth in claim 5, wherein the first inspection-use output and the second inspection-use output are combined through the logic circuit provided at the outside of said active matrix drive substrate.

8. An active matrix drive substrate for a flat panel display device provided with a horizontal scanning circuit, a vertical scanning circuit, and pixel drive circuits, comprising
   a logic circuit for combining a first output of the horizontal scanning circuit and a second output of the vertical scanning circuit and
   a combined inspection-use output terminal for outputting a combined inspection-use output obtained through said logic circuit.

9. An active matrix drive substrate for a flat panel display device provided with a horizontal scanning circuit, a vertical scanning circuit, and pixel drive circuits, comprising:
   circuit means for using a first input terminal of the horizontal scanning circuit as an inspection-use output terminal of the vertical scanning circuit and using a second input terminal of the vertical scanning circuit as an inspection-use output terminal of the horizontal scanning circuit.

10. A flat panel display device according to claim 2, wherein said circuit means comprises multiple switches.

11. The substrate according to claim 9, wherein said circuit means comprises multiple switches.

12. The substrate according to claim 10, wherein said multiple switches comprise:

- a first pair of switches arranged in series with said horizontal scanning circuit on an input side and output side respectively thereof; and
- a second pair of switches arranged in series on opposite sides of said vertical scanning circuit, on an input side and output side respectively thereof;
- a first conductor between one of said first pair of switches on said output side and one of said second pair of switches; and
- a second conductor between one of said second pair of switches on said output side and one of said first pair of switches on said input side.

13. The substrate according to claim 10, wherein said multiple switches comprise:

- a first pair of switches arranged in series with said horizontal scanning circuit on an input side and output side respectively thereof;
- a second pair of switches arranged in series on opposite sides of said vertical scanning circuit, on an input side and output side respectively thereof; and
- a first conductor between one of said first pair of switches on said output side and one of said second pair of switches on said input side; and
- a second conductor between one of said second pair of switches on said output side and one of said first pair of switches on said input side.

* * * * *